United States Patent
Nakamura et al.

(10) Patent No.: US 7,561,434 B2
(45) Date of Patent: Jul. 14, 2009

(54) WIRED CIRCUIT BOARD AND METHOD FOR MANUFACTURING WIRED CIRCUIT BOARD AND MOUNTING ELECTRONIC COMPONENT THEREON

(75) Inventors: Kei Nakamura, Osaka (JP); Hitoshi Ishizaka, Osaka (JP)

(73) Assignee: Nitto Denko Corporation, Osaka (JP)

( * ) Notice: Subject to any disclaimer, the term of this patent is extended or adjusted under 35 U.S.C. 154(b) by 164 days.

(21) Appl. No.: 11/595,984

(22) Filed: Nov. 13, 2006

(65) Prior Publication Data
US 2007/0108631 A1    May 17, 2007

(30) Foreign Application Priority Data
Nov. 14, 2005    (JP)    ............... 2005-329010

(51) Int. Cl.
*H05K 1/00* (2006.01)
*H01L 23/52* (2006.01)

(52) U.S. Cl. ................ 361/750; 257/784; 257/E23.055

(58) Field of Classification Search ................. 257/784, 257/E23.055; 361/749–751
See application file for complete search history.

(56) References Cited

U.S. PATENT DOCUMENTS

| 4,806,432 | A | | 2/1989 | Eguchi et al. |
| 5,249,576 | A | * | 10/1993 | Goldberger et al. .......... 600/323 |
| 2004/0110015 | A1 | | 6/2004 | Narui et al. |
| 2004/0163842 | A1 | | 8/2004 | Okada et al. |

FOREIGN PATENT DOCUMENTS

| EP | 1 416 535 A2 | 5/2004 |
| EP | 1 599 076 A1 | 11/2005 |
| JP | 2000-340617 | 12/2000 |
| JP | 2002-299391 | 10/2002 |
| JP | 2003-309336 | 10/2003 |
| WO | WO 03/096776 | 11/2003 |

* cited by examiner

*Primary Examiner*—Evan Pert
*Assistant Examiner*—Krista Soderholm
(74) *Attorney, Agent, or Firm*—Jean C. Edwards, Esq.; Akerman Senterfitt

(57) ABSTRACT

A wired circuit board is provided having a high-reliability conductive pattern formed thereon and mounting an electronic component thereon with high accuracy, and a method is provided for manufacturing the wired circuit board and mounting the electronic component thereon. An insulating layer including a mounting portion is formed on a metal supporting layer having a specular gloss of 150 to 500% at an incidence angle of 45°. A conductive pattern is formed on the insulating layer. By a reflection-type optical sensor, a defective shape of the conductive pattern is inspected. Then, an opening is formed by etching the portion of the metal supporting layer which is overlapping the mounting portion such that the mounting portion of the insulating layer exposed by etching has a haze value of 20 to 50%, whereby a TAB tape carrier is obtained. Thereafter, an electronic component is aligned with the mounting portion by a reflection-type optical sensor such that the electronic component is mounted on the mounting portion.

3 Claims, 6 Drawing Sheets

(a)

(b)

(c)

(d)

WIRED CIRCUIT BOARD AND METHOD FOR MANUFACTURING WIRED CIRCUIT BOARD AND MOUNTING ELECTRONIC COMPONENT THEREON

BACKGROUND OF THE INVENTION

Cross Reference to Related Application

This application claims priority from Japanese Patent Appln. No. 2005-329010, filed Nov. 14, 2005, the contents of which are herein incorporated by reference in their entirety.

1. Field of the Invention

The present invention relates to a wired circuit board and to a method for manufacturing the wired circuit board and mounting an electronic component thereon. More particularly, the present invention relates to a wired circuit board used for a TAB tape carrier or the like and to a method for manufacturing the wired circuit board and mounting an electronic component thereon.

2. Description of Related Art

Conventionally, a flexible wired circuit board on which an electronic component is mounted has been manufactured by forming a conductive pattern made of copper foil on a flexible film.

In such a flexible wired circuit board, an electronic component is mounted on a mounting portion of the flexible wired circuit board by aligning the electronic component with the mounting portion by an optical sensor which includes automatic image recognition implemented by a CCD camera or the like.

In the alignment, a portion without the conductive pattern needs sufficient transmission of sensing light therethrough, so that the flexible film is required to be sufficiently transparent.

To satisfy the requirement, there has been proposed a laminate for a flexible printed circuit board wherein, when a flexible wired circuit board is formed by a method (subtractive method) which forms a conductive pattern by etching a copper foil, a flexible insulating film has a haze (haze value) of 5 to 50% after the copper foil is removed by etching (see, e.g., Japanese Unexamined Patent Publication No. 2003-309336).

Because a TAB tape carrier on which an electronic component is mounted is also required to be sufficiently transparent for the same reason as described above, a polyester film for a TAB lead tape which has a haze value of not more than 35% has been proposed (see, e.g., Japanese Unexamined Patent Publication No. 2002-299391).

By focusing attention on the fact that the portion of the insulating layer from which the copper foil has been etched away becomes a replica of a bonded surface of the copper foil to scatter light, and thereby prevents successful execution of alignment using transmitted light in an IC mounting, there has been also proposed a flexible printed wiring board for a COF (Chip-On-Film), wherein the surface roughness (Rz) of the electrolytic copper foil which has been bonded to the insulating layer is 0.05 to 1.5 μm and the specular gloss of the bonded surface at an incidence angle of 60° is not less than 250 (see, e.g., International Publication WO 2003/096776).

With regard to a TAB tape carrier, it has been known to reinforce the tape carrier with a metal supporting layer such as a copper foil. Such a TAB tape carrier is manufactured by forming an insulating layer on a metal supporting layer, forming a conductive pattern on the insulating layer, and then locally etching away the metal supporting layer except for the portion which needs reinforcement (see, e.g., FIG. 2 of Japanese Unexamined Patent Publication No. 2000-340617).

In the manufacturing of the TAB tape carrier mentioned above, it is a normal practice to optically inspect a defective shape of the conductive pattern before removing the metal supporting layer. More specifically, as shown in FIG. 8, a defective shape of a conductive pattern 41 is determined by, e.g., irradiating a surface of an insulating layer 32 including the conductive pattern 41 with sensing light (indicated by the solid arrow) and sensing the sensing light reflected from the conductive pattern 41 by an optical sensor.

However, as the pitch of a conductive pattern has become increasingly finer in recent years, it is necessary to improve the accuracy of the inspection for determining the deficiency. In the above-mentioned inspection, on the other hand, there is a case where even any of reflected light (indicated by the dashed arrow in FIG. 8) from the metal supporting layer 33 may increase the possibility of making an erroneous determination in the inspection as the pitch of the conductive pattern is finer. To improve the inspection accuracy, the specular gloss of the metal supporting layer 33 should be set low for the prevention of such an erroneous determination.

On the other hand, the increasing miniaturization of an electronic component in recent years has created a demand for highly-accurate alignment in the mounting of the electronic component. When an electronic component is mounted, the electronic component is aligned with the mounting portion of a wired circuit board by an optical sensor, as described above, so that the insulating layer 32 is required to be sufficiently transparent. However, when the specular gloss of the metal supporting layer 33 is excessively low, it is difficult to impart satisfactory transparency to the portion of the insulating layer 32 from which the metal supporting layer 33 has been etched away. This causes the problem of a reduction in the accuracy of alignment between the electronic component and the mounting portion of the wired circuit board.

SUMMARY OF THE INVENTION

It is therefore an object of the present invention to provide a wired circuit board which has a high-reliability conductive pattern formed thereon and enables accurate mounting of an electronic component thereon and to a method for manufacturing the wired circuit board and mounting an electronic component thereon.

A wired circuit board according to the present invention comprises: a metal supporting layer having a specular gloss of 150 to 500% at an incidence angle of 45° and having an opening formed therein; an insulating layer formed on the metal supporting layer, and including a mounting portion which is exposed from the opening and having a haze value of 20 to 50%; and a conductive pattern formed on the insulating layer.

A method for manufacturing a wired circuit board and mounting an electronic component thereon according to the present invention comprises the steps of preparing a metal supporting layer having a specular gloss of 150 to 500% at an incidence angle of 45°; forming an insulating layer including a mounting portion on the metal supporting layer; forming a conductive pattern on the insulating layer; placing an optical sensor so as to reflect a sensing light at the conductive pattern and inspecting a defective shape of the conductive pattern by the optical sensor; etching a portion of the metal supporting layer which is overlapping the mounting portion to form an opening such that the insulating layer of the mounting portion exposed by etching has a haze value of 20 to 50%; and placing an optical sensor to allow transmission of the sensing light through the insulating layer of the mounting portion, aligning the electronic component with the mounting portion by using the optical sensor, and mounting the electronic component on the mounting portion.

In the wired circuit board according to the present invention, the specular gloss of the metal supporting layer at an incidence angle of 45° is set not more than 500%. Therefore, when the defective shape of the conductive pattern is inspected by an optical sensor, which is performed by reflecting the sensing light by the conductive pattern, the sensing light can be diffused in the metal supporting layer. This can reduce erroneous determinations in the inspection to improve inspection accuracy. As a result, a wired circuit board formed with a high-reliability conductive pattern can be provided.

Moreover, since the specular gloss of the metal supporting layer at an incidence angle of 45° is set in the range of 150 to 500% in the wired circuit board according to the present invention, the haze value of the insulating layer of the mounting portion which is exposed from the opening of the metal supporting layer can be set in the range of 20 to 50%, which is optimal for the transmission of the sensing light. This allows excellent transmission of the sensing light for aligning an electronic component through the insulating layer of the mounting portion. As a result, the electronic component can be mounted with accuracy.

In the method for manufacturing a wired circuit board and mounting an electronic component thereon according to the present invention, the specular gloss of the metal supporting layer at an incidence angle of 45° is set not more than 500%. Therefore, in the step of reflecting the sensing light by the conductive pattern and thereby inspecting a defective shape of the conductive pattern by the optical sensor, the sensing light from the optical sensor can be diffused in the metal supporting layer. This can reduce erroneous determinations in the inspection to improve inspection accuracy. As a result, a high-reliability conductive pattern can be formed.

Moreover, since the specular gloss of the metal supporting layer at an incidence angle of 45° is set in the range of 150 to 500% in the method for manufacturing a wired circuit board and mounting an electronic component thereon according to the present invention, the haze value of the insulating layer of the mounting portion which is exposed from the opening of the metal supporting layer can be set in the range of 20 to 50%, which is optimal for the transmission of the sensing light. This allows excellent transmission of the sensing light through the insulating layer of the mounting portion in the step of mounting the electronic component on the mounting portion. As a result, the electronic component can be mounted with accuracy.

BRIEF DESCRIPTION OF THE DRAWINGS

FIG. 4 is a production process drawing of the TAB tape carrier shown in FIG. 1 showing a cross section taken along the line A-A' of FIG. 2 for illustrating a method for manufacturing the wired circuit board and mounting an electronic component thereon according to an embodiment of the present invention, of which:

Figure 1:
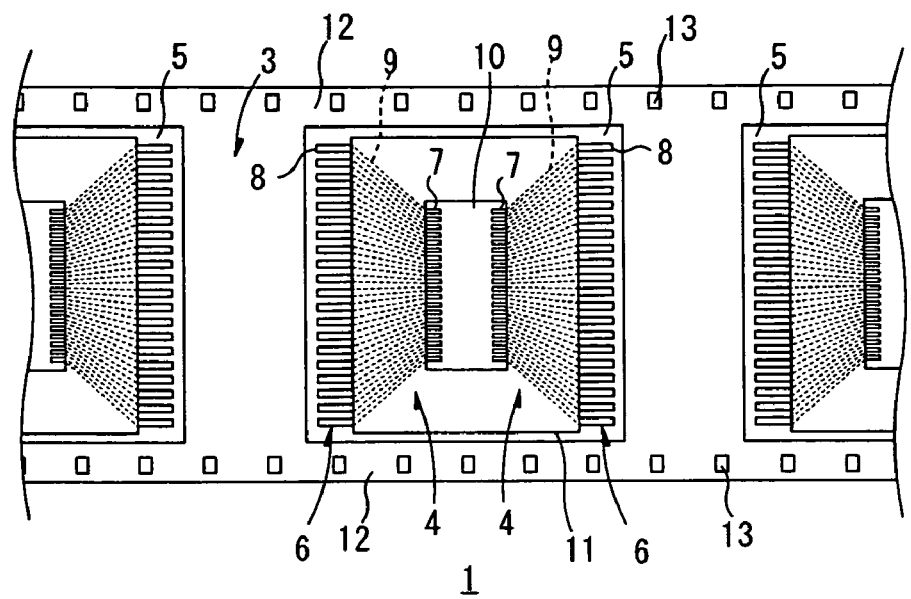
FIG. 1 is a partial plan view showing a TAB tape carrier as an embodiment of a wired circuit board according to the present invention.
Figure 4:
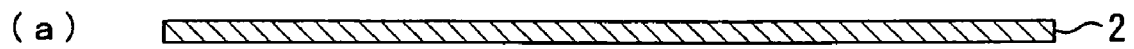
Figure 4:
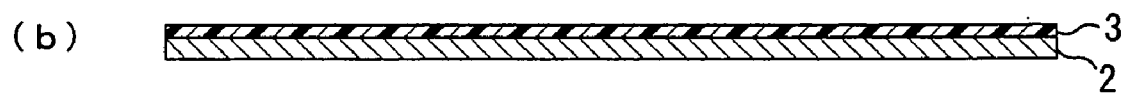
Figure 4:
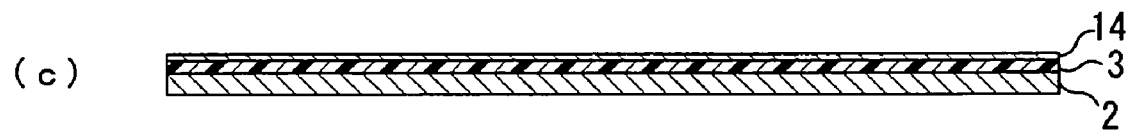
Figure 4:
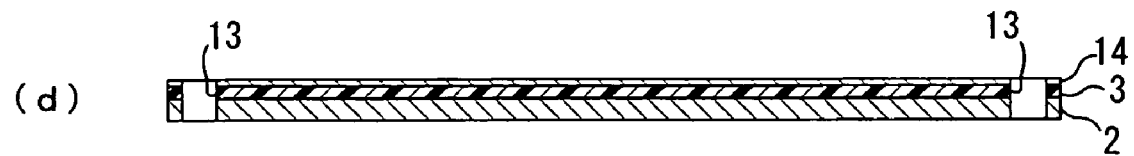
Figure 5:
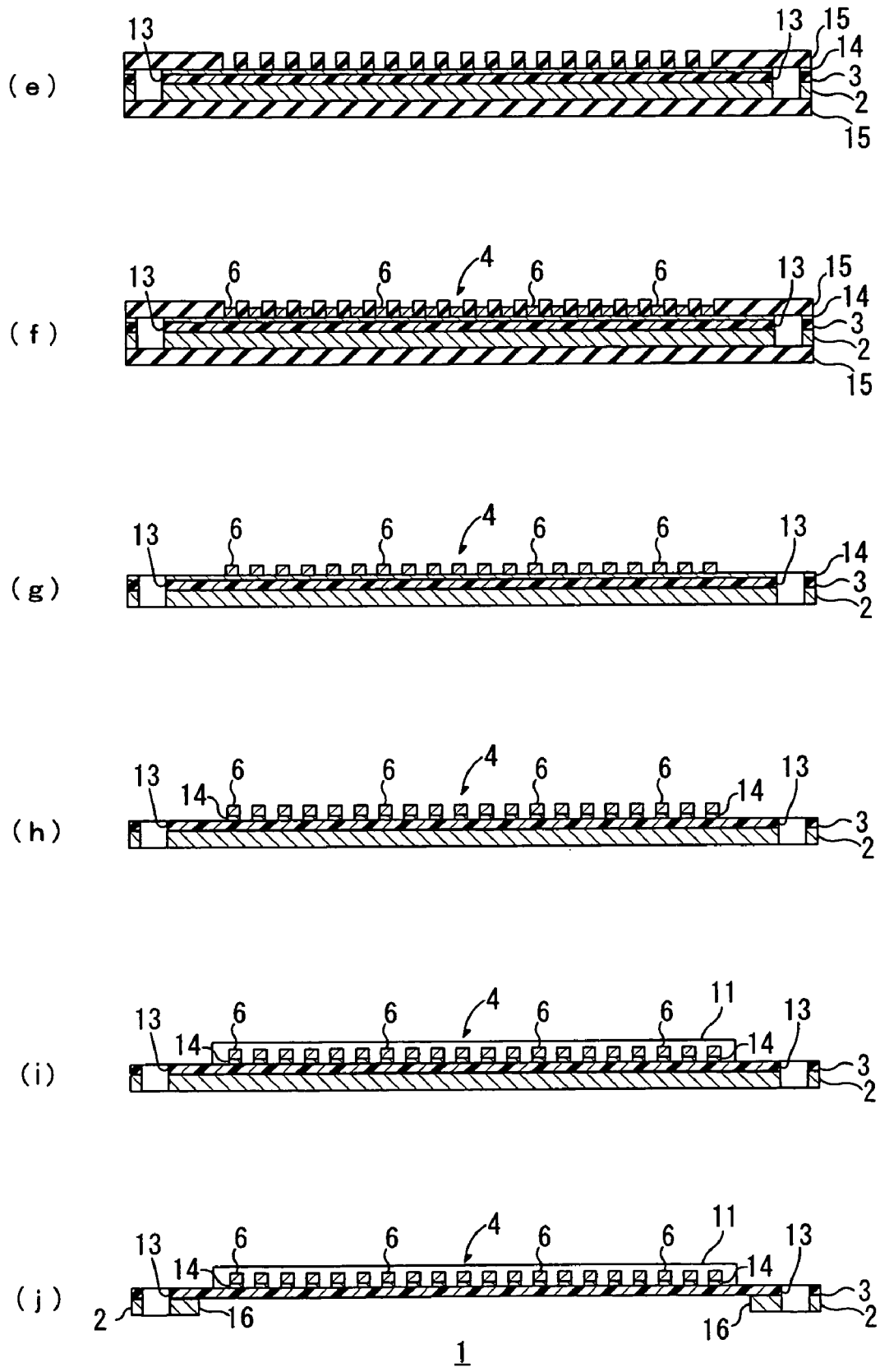
Figure 6:
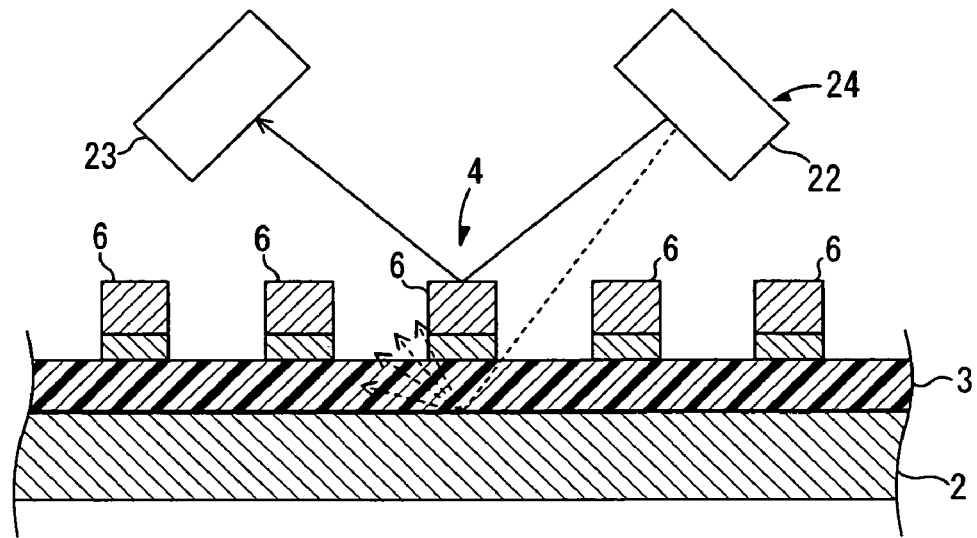
Figure 7:
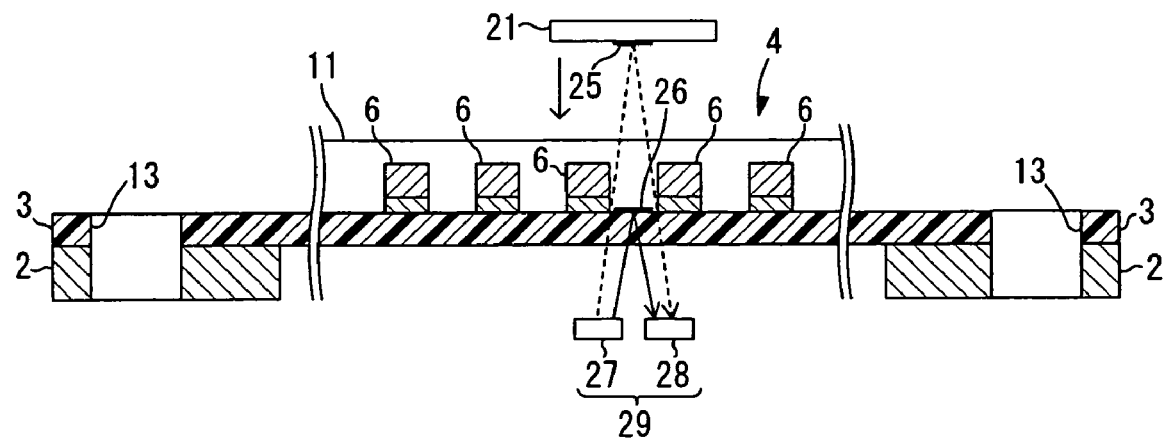
Figure 8:
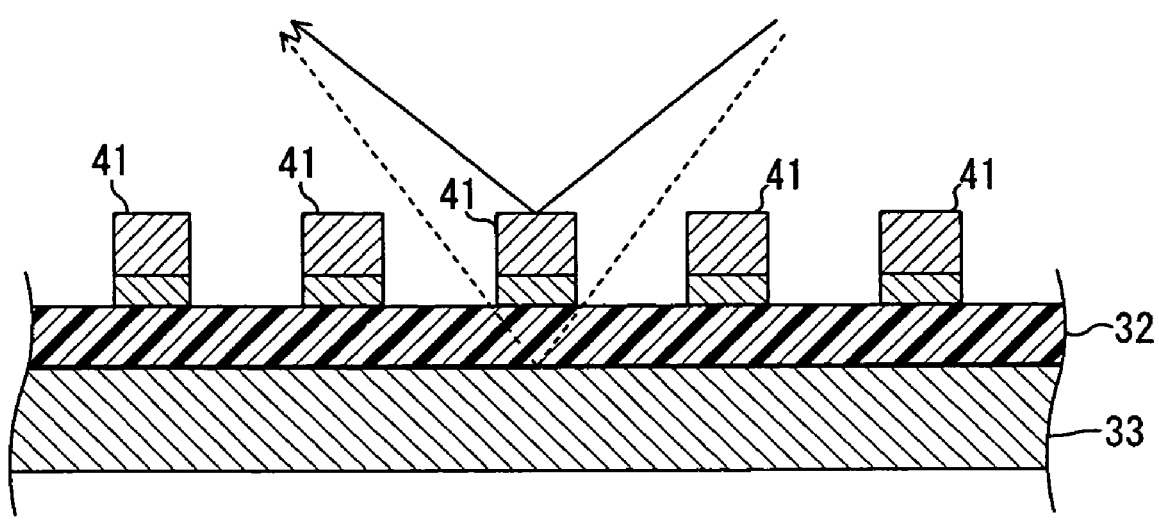

(a) shows the step of preparing a metal supporting layer;
(b) shows the step of forming an insulating layer on the metal supporting layer;

(c) shows the step of forming a seed film on the entire surface of the insulating layer; and
(d) shows the step of boring feed holes;

FIG. 5 is a production process drawing of the TAB tape carrier shown in FIG. 1 showing the cross section taken along the line A-A' of FIG. 2 for illustrating, subsequently to FIG. 4, the method for manufacturing the wired circuit board and mounting an electronic component thereon according to the embodiment of the present invention, of which:

(e) shows the step of forming a plating resist on the seed film;
(f) shows the step of forming a conductive pattern on the portion of the seed film which is exposed from the plating resist by electrolytic plating;
(g) shows the step of removing the plating resist;
(h) shows the step of removing the portion of the seed film which is exposed from the conductive pattern;
(i) shows the step of forming a covering layer; and
(j) shows the step of forming an opening in the portion of the metal supporting layer which positionally corresponds to a conductive pattern formation region;

FIG. 6 is a view for illustrating the step of optically inspecting a defective shape of the conductive pattern in the manufacturing of the TAB tape carrier shown in FIG. 1;

FIG. 7 is a view for illustrating the alignment of an electronic component when it is mounted on the TAB tape carrier shown in FIG. 1; and FIG. 8 is a view for illustrating the step of optically inspecting a defective shape of a conductive pattern in the manufacturing of a conventional TAB tape carrier.

DESCRIPTION OF THE PREFERRED EMBODIMENTS

FIG. 1 is a partial plan view showing a TAB tape carrier as an embodiment of a wired circuit board according to the present invention. FIG. 2 is a partially enlarged plan view of the TAB tape carrier shown in FIG. 1. FIG. 3 is a partial bottom view of the TAB tape carrier shown in FIG. 1. FIGS. 4 and 5 are manufacturing process diagrams of the TAB tape carrier shown in FIG. 1 each for illustrating a method for manufacturing the wired circuit board and mounting an electronic component thereon according to an embodiment of the present invention.

As shown in, e.g., FIG. 5(j), a TAB tape carrier 1 comprises a metal supporting layer 2 in the form of a tape continuously extending in a longitudinal direction, an insulating layer 3 formed on the metal supporting layer 2 and a conductive pattern 4 formed on the insulating layer 3.

In the TAB tape carrier 1, as shown in FIG. 1, the insulating layer 3 has a plurality of conductive pattern formation regions 5 which are provided in mutually spaced-apart relation in the longitudinal direction of the metal supporting layer 2 (which is equal to the longitudinal direction of the TAB tape carrier 1. It is occasionally simply referred to as the longitudinal direction thereafter).

Figure 2:
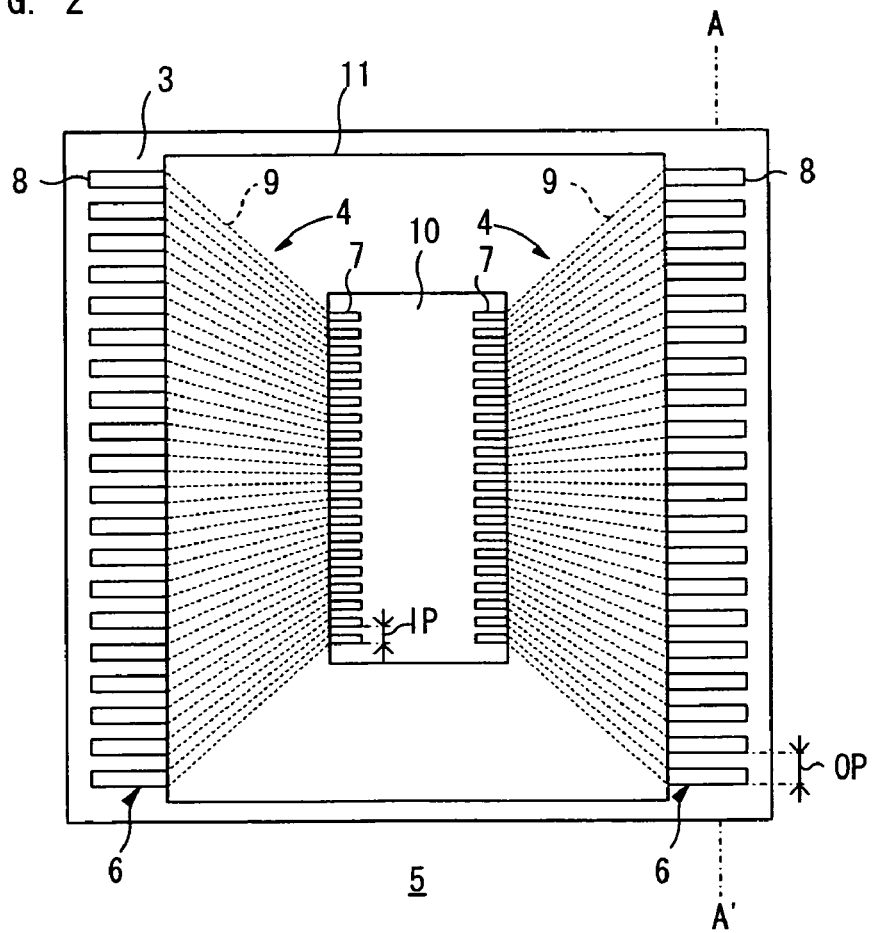
FIG. 2 is a partially enlarged plan view of the TAB tape carrier shown in FIG. 1.
Figure 3:
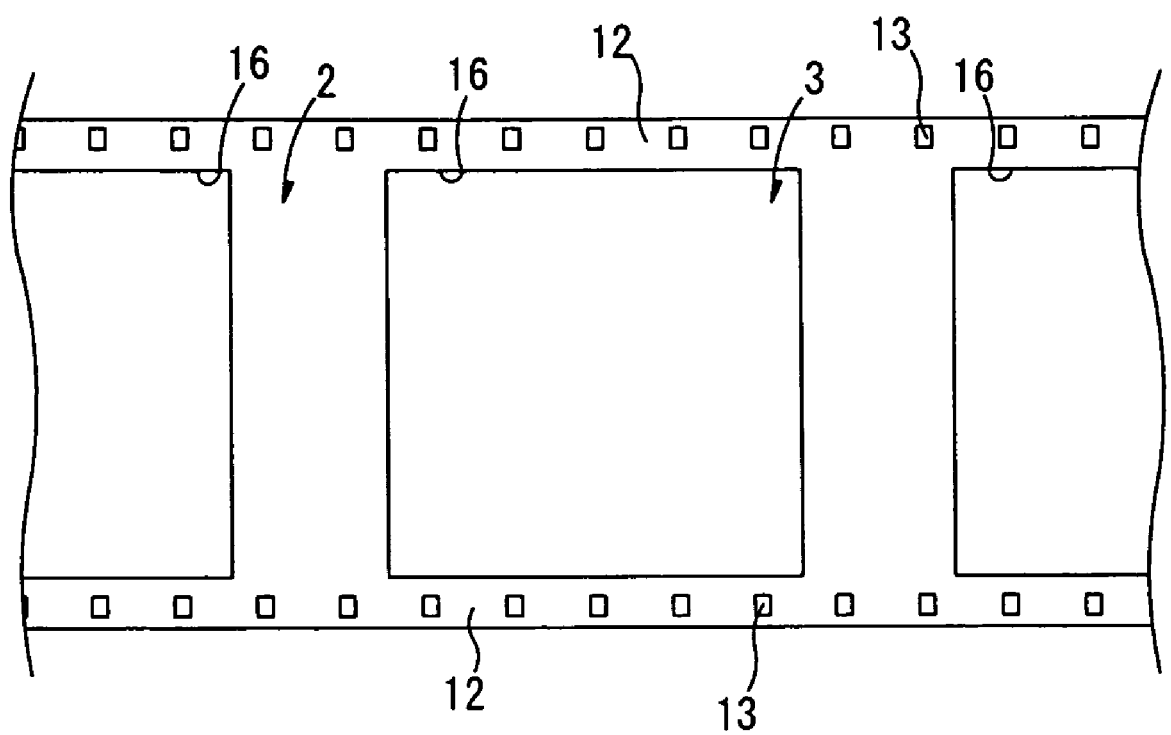
FIG. 3 is a partial bottom view of the TAB tape carrier shown in FIG. 1.

As shown in FIG. 2, each of the conductive pattern formation regions 5 has a generally rectangular shape when viewed in a plan view. At the center portion of the conductive pattern formation region 5, a mounting portion 10 having a generally rectangular shape when viewed in a plan view is provided to mount an electronic component 21 (see FIG. 7), such as an IC chip.

The conductive pattern 4 is formed on both longitudinal sides of the mounting portion 10 in each of the conductive pattern formation regions 5. Specifically, the conductive pattern 4 comprises a plurality of wires 6 arranged in mutually spaced-apart relation. Each of the wires 6 comprises an inner lead 7, an outer lead 8 and a relay lead 9 which are provided integrally in continuous relation.

The inner leads 7 are arranged in mutually spaced-apart relation to face the inside of the mounting portion 10 to extend in the longitudinal direction, and align in parallel in the widthwise direction of the TAB tape carrier 1.

The pitch (i.e., the total sum of the width of each of the inner leads 7 and the distance (spacing) between any two of the adjacent inner leads 7) IP of each of the inner leads 7 is set to a value of not more than 60 μm, preferably not more than 50 μm, and normally not less than 10 μm. By thus setting the pitch IP of each of the inner leads 7 to not more than 60 μm, high-density wiring can be implemented.

The width of each of the inner leads 7 is set in the range of 5 to 50 μm or preferably 10 to 40 μm. The distance (spacing) between any two of the adjacent inner leads 7 is set in the range of 5 to 50 μm or preferably 10 to 40 μm.

The outer leads 8 are arranged at the both longitudinal ends of each of the conductive pattern formation regions 5 to extend longitudinally and align widthwise in mutually spaced-apart relation.

The pitch (i.e., the total sum of the width of each of the outer leads 8 and the distance (spacing) between any two of the adjacent outer leads 8) OP of each of the outer leads 8 is set, e.g., about 100 to 1000% of the pitch IP of each of the inner leads 7. Thus, the pitch OP of each of the outer leads 8 is set larger than or the same as the pitch IP of each of the inner leads 7.

The relay leads 9 relay the inner leads 7 to the outer leads 8 so as to continue the inner leads 7 and the outer leads 8 each other. The relay leads 9 are arranged to expand radially in the longitudinal direction from the inner leads 7 having a smaller pitch toward the outer leads 8 having a larger pitch.

In the area in which the relay leads 9 are arranged, a covering layer 11 such as a solder resist is provided on the insulating layer 3 to cover the relay leads 9. That is, the covering layer 11 is formed in each of the pattern formation regions 5 to have a generally rectangular frame-like shape so as to surround the mounting portion 10 and is provided to cover all the relay leads 9.

Preferably, the inner leads 7 and the outer leads 8 are covered appropriately with a nickel plating layer and a gold plating layer, though they are not shown.

In the TAB tape carrier 1, openings 16 for exposing the mounting portions 10, each of which has a rectangular shape when viewed in a bottom view, are formed in the metal supporting layer 2 to correspond to the respective back surfaces of the conductive pattern formation regions 5, as shown in FIG. 3.

The TAB tape carrier 1 is also formed with transport portions 12 for transporting the TAB tape carrier 1. As shown in FIG. 1, the transport portions 12 are provided at the both widthwise side ends of the TAB tape carrier 1 to extend in the longitudinal direction. To transport the TAB tape carrier 1, a plurality of feed holes 13 for engagement with a sprocket or the like are formed in the both transport portions 12 such that they are opposed in the widthwise direction. The feed holes 13 are bored at equal spacings in the longitudinal direction of the TAB tape carrier 1 to pierce through the TAB tape carrier 1 (to pierce through the metal supporting layer 2 and the insulating layer 3). Each of the feed holes 13 is bored to have a 1.981×1.981 mm quadrilateral hole shape and a space between two adjacent feed holes 13 is set, e.g., 4.75 mm.

Next, a description is given to a method for manufacturing the TAB tape carrier 1.

As shown in FIG. 4(a), in the method, the metal supporting layer 2 is prepared first. For the metal supporting layer 2, stainless steel foil, copper foil, copper alloy foil, or the like is used. The thickness of the metal supporting layer 2 is in the range of, e.g., 3 to 100 μm, preferably 5 to 30 μm, or more preferably 8 to 20 μm. The width of the metal supporting layer 2 is in the range of, e.g., 100 to 1000 μm or preferably 150 to 400 μm.

The prepared metal supporting layer 2 has a specular gloss in the range of 150 to 500%, preferably 150 to 450%, or more preferably 150 to 250% at an incidence angle of 45°. When the specular gloss is less than 150%, the alignment of the electronic component 21 when it is mounted becomes difficult, as is described later. When the specular gloss is over 500%, an erroneous determination is likely to develop in the inspection of a defective shape of the conductive pattern 4, which is described later.

The specular gloss can be measured at an incidence angle of 45° in accordance with JIS Z 8741-1997 "Specular Glossiness—Method of Measurement". Such a specular gloss can be measured by a typical gloss meter.

The specular gloss of the metal supporting layer 2 can be adjusted to be in the range shown above by adjusting the roughness of the surface of a roll in, e.g., a rolling step in the manufacturing of the metal supporting layer 2. When the metal supporting layer 2 has a high specular gloss, it can be adjusted to be in the range shown above by performing a surface roughening step using a chemical agent or the like with respect to the metal supporting layer 2.

Although each of FIGS. 4 and 5 shows the single TAB tape carrier 1, it is a normal practice to simultaneously produce a plurality of the TAB tape carriers 1 to be arranged in the widthwise direction of the metal supporting layer 2 and slit them into individual strips.

For example, from a stainless steel foil having a width of 250 nm, the four TAB tape carriers 1 each having a width of 48 mm are simultaneously produced. From a stainless steel foil having a width of 300 nm, the four TAB tape carrier 1 each having a width of 70 mm are simultaneously produced.

Next, as shown in FIG. 4(b), the insulating layer 3 is formed on the metal supporting layer 2. As an insulator for forming the insulating layer 3, a synthetic resin such as a polyimide resin, an acrylic resin, a polyethernitrile resin, a polyethersulfone resin, a polyethylene terephthalate resin, a polyethylene naphthalate resin, or a polyvinyl chloride resin is used. Preferably, a polyimide resin is used.

To form the insulating layer 3 on the metal supporting layer 2, a resin solution, e.g., is applied onto the metal supporting layer 2, dried, and then heated to be cured. The resin solution can be prepared by dissolving the resin shown above in an organic solvent or the like. As the resin solution, a solution of, e.g., a polyamic acid resin, which is a precursor of polyimide, or the like is used. The application of the resin is performed by a known coating method such as a doctor blade method or a spin coating method. After the resin is dried appropriately by heating, it is heated at 200 to 600° C. to be cured so that the insulating layer 3 made of a resin film having flexibility is formed on the metal supporting layer 2.

The insulating layer 3 can also be formed by preliminarily forming a resin into a film shape and bonding the resultant resin film to the metal supporting layer 2 via an adhesive agent.

The insulating layer 3 can also be formed in a specific pattern by, e.g., applying a solution of a photosensitive resin such as a photosensitive polyamic acid resin onto the metal supporting layer 2, exposing the applied solution to light, and then developing it.

The thickness of the insulating layer 3 thus formed is, e.g., not more than 50 μm, preferably not more than 30 μm, or more preferably not more than 15 μm, and normally not less than 3 μm.

Then, in the method, the conductive pattern 7 is formed in the form of the wired circuit pattern mentioned above on the surface of the insulating layer 3.

Examples of a conductor used to form the conductive pattern 4 include copper, nickel, gold, a solder, and alloys thereof. Preferably, copper is used. The formation of the conductive pattern 4 is not particularly limited. For example, the conductive pattern 4 is formed on the surface of the insulating layer 3 by a known patterning method such as a subtractive method or an additive method. Of these patterning methods, the additive method is preferably used as shown in FIGS. 4(c) to 5(h) in terms of enabling the formation of the conductive pattern 4 with a fine pitch.

Specifically, as shown in FIG. 4(c), in the additive method, a thin film of a conductor serving as a seed film 14 is formed on the entire surface of the insulating layer 3 first. For the formation of the seed film 14, a vacuum vapor deposition method, preferably a sputter vapor deposition method, is used. For the conductor for forming the seed film 14, chromium, copper, and the like are preferably used. More specifically, the seed film 14 is formed by, e.g., successively forming a chromium thin film and a copper thin film on the entire surface of the insulating layer 3 by a sputter vapor deposition method. In the formation of the seed film 14, the thickness of the chromium thin film is set in the range of, e.g., 100 to 600 Å and the thickness of the copper thin film is set in the range of, e.g., 500 to 2000 Å.

Then, as shown in FIG. 4(d), in the method, the plurality of feed holes 13 described above are formed in the both widthwise side ends of the TAB tape carrier 1 such that they are bored in the longitudinal direction and pierce through the metal supporting layer 2, the insulating layer 3, and the seed film 14 along the thickness thereof. Examples of a known processing method used to bore the feed holes 13 include drilling, laser processing, punching, and etching. Preferably, punching is used.

Then, as shown in FIG. 5(e), in the method, a plating resist 15 is formed in the form of a reversed pattern of the wired circuit pattern mentioned above on the seed film 14. The plating resist 15 is formed in a predetermined resist pattern by a known method using, e.g., a dry film resist or the like. The plating resist 15 is also formed on the entire surface of the metal supporting layer 2.

Then, as shown in FIG. 5(f), the conductive pattern 4 is formed in the form of wired circuit pattern mentioned above on the portion of the seed film 14 exposed from the plating resist 15 by electrolytic plating. As the electrolytic plating, electrolytic copper plating is preferably used.

Then, as shown in FIG. 5(g), the plating resist 15 is removed by, e.g., a known etching method such as a chemical etching (wet etching) or peeling it off. Thereafter, as shown in FIG. 5(h), the portion of the seed film 14 exposed from the conductive pattern 4 is similarly removed by a known etching method such as a chemical etching (wet etching).

As a result, the conductive pattern 4 is formed as the wired circuit pattern of the wirings 6 in which the inner leads 7, the outer leads 8, and the relay leads 9 are formed integrally in continuous relation on the insulating layer 3, as described above. The thickness of the conductive pattern 4 is in the range of, e.g., 3 to 50 μm and preferably 5 to 25 μm.

At this stage, in the method, optical inspection is conducted for detecting a defective shape of the conductive pattern 4. As shown in FIG. 6, the inspection detects the defective shape of the conductive pattern 4 by placing a reflection-type optical sensor 24 comprising a light emitting unit 22 and a light receiving unit 23 above the insulating layer 3 including the conductive pattern 4 in opposing relation, emitting sensing light from the light emitting unit 22 toward the insulating layer 3 including the conductive pattern 4 to irradiate it, and sensing the reflected light (sensing light) from the conductive pattern 4 by the light receiving unit 23, as shown in FIG. 6.

In the inspection, even when the sensing light emitted from the light emitting unit 22 for irradiation transmits through the insulating layer 3 and is reflected by the metal supporting layer 2, the sensing light can be diffused in the metal supporting layer 2 since the specular gloss of the metal supporting layer 2 at an incidence angle of 45° is set not more than 500%. This can reduce erroneous determinations in the inspection and thereby improves inspection accuracy.

Next, as shown in FIG. 5(i), in the method, the covering layer 11 is formed in the form of a rectangular frame-like shape to cover the relay leads 9 of the wires 6 and surround the mounting portion 10. The covering layer 11 is formed by a known method using a photosensitive solder resist or the like.

Thereafter, the exposed portions of the wires 6, i.e., the inner leads 7 and the outer leads 8 are covered with a nickel plated layer and a gold plated layer. The nickel plated layer and the gold plated layer are formed by, e.g., nickel plating and gold plating, respectively.

Then, as shown in FIG. 5(j), the opening 16 is formed in the portion of the metal supporting layer 2 which positionally corresponds to each of the conductive pattern formation regions 5, whereby the TAB tape carrier 1 is obtained.

To form the openings 16 in the metal supporting layer 2, the portions of the metal supporting layer 2 which are individually overlapping the conductive pattern formation regions 5 are bored by wet etching (chemical etching). The etching is accomplished by covering the metal supporting layer 2 except for the portions thereof corresponding to the openings 16 with an etching resist, performing etching using a known etchant solution such as a ferric chloride solution, and then removing the etching resist. Thereafter, when the plurality of TAB tape carriers 1 are produced to be arranged in the widthwise direction of the metal supporting layer 2, the TAB tape carriers 1 are slit into individual strips.

When the plurality of TAB tape carriers 1 arranged in the widthwise direction of the metal supporting layer 2 are simultaneously produced and then slit into the individual strips, the slit portions of the metal supporting layer 2, which are located between the TAB tape carriers 1, are simultaneously removed with the portions thereof corresponding to the openings 16.

In each of the TAB tape carriers 1 thus obtained, the specular gloss of the metal supporting layer 2 at an incidence angle of 45° is set not more than 500%, as described above, so that the defective shape of the conductive pattern 4 formed with a fine pitch is precisely and reliably detected. As a result, the TAB tape carrier 1 formed with the high-reliability conductive pattern 4 can be obtained.

Then, the electronic component 21 is mounted on the TAB tape carrier 1.

To mount the electronic component 21 on the TAB tape carrier 1, the electronic component 21 and the surface (the surface on which the conductive pattern 4 is formed) of the mounting portion 10 of the insulating layer 3 are provided with respective marks 25 and 26 for alignment respectively, and a reflection-type optical sensor 29 comprising a light emitting unit 27 and a light receiving unit 28 is placed below the portion of the insulating layer 3 corresponding to the opening 16 in opposing relation, as shown in FIG. 7. Sensing light is emitted from the light emitting unit 27 toward each of the marks 25 and 26 to irradiate them and the sensing light transmitted through the insulating layer 3 of the mounting portion 10 and reflected by each of the marks 25 and 26 is received by the light receiving unit 28, so that alignment is performed by recognizing the marks 25 and 26.

Since the shape of the metal supporting layer 2 that is removed in the step of forming the opening 16 shown in FIG. 5(j) is transferred onto the back surface of the insulating layer 3 in the opening 16, when the specular gloss of the metal supporting layer 2 at an incidence angle of 45° is less than 150%, the haze value of the insulating layer 3 in the opening 16 becomes excessively high. As a result, each sensing light emitted from the light emitting unit 27 for irradiation and the sensing light reflected from each of the marks 25 and 26 is less likely to transmit through the insulating layer 3, so that the alignment of the electronic component 21 incurs a problem.

In the TAB tape carrier 1, however, the specular gloss of the metal supporting layer 2 at an incidence angle of 45° is set not less than 150%, as described above. This setting prevents the haze value of the portion of the insulating layer 3 which is exposed from the opening 16 as a result of boring the metal supporting layer 2 from becoming excessively high and thereby allows excellent transmission of the sensing light for aligning the electronic component 21 through the insulating layer 3. As a result, the electronic component 21 can be mounted with accuracy.

In view of this, the haze value of the insulating layer 3 in the opening 16 is set in the range of 20 to 50% or preferably 20 to 40%. The haze value is given by the following expression (1) and can be measured by using, e.g., a reflectometer/transmissometer (HR-100 commercially available from Murakami Color Research Laboratory Co., Ltd.) in accordance with JIS K 7105 5.5:

$$\text{Haze Value (\%)} = Td/Tt \times 100 \quad (1)$$

wherein Td is a light transmittance (%) and Tt is a diffuse transmittance (%).

When the haze value of the insulating layer 3 in the opening 16 is less than 20%, external light is reflected at the surface of the insulating layer 3, so that the problem of lower inspection accuracy occurs. When the haze value of the insulating layer 3 in the opening 16 exceeds 50%, the transmission of the sensing light through the insulating layer 3 is inferior. By setting the haze value of the insulating layer 3 in the opening 16 in the range to 20 to 50%, the sensing light for aligning the electronic component 21 is excellently transmitted through the insulating layer 3. As a result, the electronic component 21 can be mounted with accuracy.

Although the description has thus been given by using the TAB tape carrier as an example of the wired circuit board according to the present invention, the wired circuit board according to the present invention is not limited thereto. The present invention is also widely applicable to another wired circuit board.

EXAMPLES

The present invention is described more specifically by showing the examples and comparative example thereof herein below.

In each of the following examples, the operation of simultaneously producing four TAB tape carriers each having a width of 48 mm by using a stainless steel foil having a width of 250 mm was repeatedly performed a plurality of times.

Example 1

A metal supporting layer made of a stainless steel foil (SUS 304 with a thickness of 20 μm and a width of 250 mm) having a specular gloss of 200% at an incidence angle of 45° was prepared (see FIG. 4(a)). A solution of a polyamic acid resin was applied to the metal supporting layer, dried, and then heated to be cured to form an insulating layer made of a polyimide resin having a thickness of 25 μm (see FIG. 4(b)). Then, a chromium thin film with a thickness of 300 Å and a copper thin film with a thickness of 2000 Å were successively formed on a surface of the insulating layer by a sputtering vapor deposition method, thereby forming a seed film (see FIG. 4(c)).

Thereafter, feed holes were bored by punching to pierce through the metal supporting layer, the insulating layer, and the seed film in the thicknesses thereof (see FIG. 4(d)). Then, a plating resist was formed in a predetermined pattern on a surface of the seed film and on the entire surface of the metal supporting layer (see FIG. 5(e)).

Then, the plating resist was dipped in an electrolytic copper sulfate plating solution and a surface of the portion of the seed film exposed from the plating resist was subjected to electrolytic copper plating at 2.5 A/dm$^2$ for abut 20 minutes, whereby a conductive pattern with a thickness of 10 μm was formed (see FIG. 5(f)).

The conductive pattern was formed as a pattern of a plurality of wires arranged in mutually spaced-apart relation and comprising inner leads, outer leads, and relay leads which were formed integrally in continued relation. The pitch of the inner leads was 30 μm and the pitch of the outer leads was 100 μm.

Then, after the plating resist was removed by a chemical etching (see FIG. 5(g)), the portion of the seed film exposed from the conductive pattern was similarly removed by a chemical etching (see FIG. 5(h)).

Thereafter, a short-circuit between the individual wires was inspected based on the shape of the conductive pattern by a light reflection method using an automatic appearance inspection system (reflection-type optical sensor) so that defective and non-defective products were screened. Then, a verification test was performed by an electrical conduction test to verify that there was no erroneous determination in the automatic appearance inspection system.

Subsequently, a photosensitive solder resist was formed to cover the respective relay leads of the wires and to surround each of the conductive pattern formation regions (see FIG. 5(i)). Then, the inner leads and the outer leads were covered by plating with nickel and gold.

Then, the metal supporting layer except for the portions thereof which positionally correspond to the conductive pattern formation regions and the slit formation regions was covered with an etching resist and etched by using a ferric chloride solution such that the openings and the slit portions between the individual TAB tape carriers were formed (see FIG. 5(j)), whereby the TAB tape carriers were obtained. In each of the TAB tape carries obtained, the haze value of the portion of the insulating layer which was exposed from the opening was 40%.

Subsequently, an IC chip was mounted on each of the obtained TAB tape carriers by using an IC mounting machine (inner lead bonder), while aligning the IC chip by a light reflection method using a position sensing apparatus (optical sensor). In the mounting, the marks on the IC chip and the conductive pattern were sufficiently recognizable and the IC chip could be precisely mounted at a proper position.

Example 2

TAB tape carriers were obtained in the same manner as in Example 1 except that a stainless steel foil having a specular gloss of 450% at an incidence angle of 45° was used. After inspecting the shape of the conductive patterns of the TAB tape carriers by a light reflection method, it was verified by the subsequent conduction test that there was no erroneous determination in the inspection.

In each of the TAB tape carriers obtained, the haze value of the portion of the insulating layer exposed from the opening was 20%.

As a result of mounting an IC chip on each of the obtained TAB tape carriers in the same manner as in Example 1, the IC chip could be precisely mounted at a proper position.

Comparative Example 1

TAB tape carriers were obtained in the same manner as in Example 1 except that a stainless steel foil having a specular gloss of 800% at an incidence angle of 45° was used. After inspecting the shape of the conductive patterns of the TAB tape carriers by a light reflection method, it was verified by the subsequent conduction test that, in products determined non-defective in the inspection, defective products with short-circuits were mixed.

In each of the TAB tape carriers obtained, the haze value of the portion of the insulating layer exposed from the opening was 5%.

Comparative Example 2

TAB tape carriers were obtained in the same manner as in Example 1 except that a stainless steel foil having a specular gloss of 100% at an incidence angle of 45° was used. After inspecting the shape of the conductive patterns of the TAB tape carriers by a light-reflection method, it was verified by the subsequent conduction test that there was no erroneous determination in the inspection.

In each of the TAB tape carriers obtained, the haze value of the portion of the insulating layer exposed from the opening was 60%.

As a result of mounting an IC chip on each of the obtained TAB tape carriers in the same manner as in Example 1, the marks on the IC chip and on the conductive pattern were not sufficiently recognizable and misalignment in the mounting of the IC chip was recognized.

While the illustrative embodiments of the present invention are provided in the above description, such is for illustrative purpose only and it is not to be construed limitative. Modification and variation of the present invention that are obvious to those skilled in the art is to be covered by the following claims.

What is claimed is:

1. A wired circuit board comprising:
   a metal supporting layer having a specular gloss of 150 to 500% at an incidence angle of 45° and having an opening formed therein;
   an insulating layer formed on the metal supporting layer, and including a mounting portion which is exposed from the opening and having a haze value of 20 to 50%; and
   a conductive pattern formed on the insulating layer.

2. The wired circuit board of claim 1, wherein the metal supporting layer has a specular gloss of 150 to 450% at an incidence angle of 45°.

3. The wired circuit board of claim 1, wherein the metal supporting layer has a specular gloss of 150 to 250% at an incidence angle of 45°.

* * * * *